United States Patent
Koh

(10) Patent No.: US 11,029,660 B2
(45) Date of Patent: Jun. 8, 2021

(54) SAFETY INPUT SYSTEM FOR MONITORING A SENSOR IN AN INDUSTRIAL AUTOMATION SYSTEM

(71) Applicant: Rockwell Automation Asia Pacific Business Center, Pte. Ltd., Singapore (SG)

(72) Inventor: Kian Kiat Koh, Singapore (SG)

(73) Assignee: Rockwell Automation Asia Pacific Business Center, Pte. Ltd., Singapore (SG)

( * ) Notice: Subject to any disclaimer, the term of this patent is extended or adjusted under 35 U.S.C. 154(b) by 500 days.

(21) Appl. No.: 15/595,151

(22) Filed: May 15, 2017

(65) Prior Publication Data

US 2018/0329385 A1    Nov. 15, 2018

(51) Int. Cl.
*G05B 19/042* (2006.01)
*G05B 23/02* (2006.01)
(Continued)

(52) U.S. Cl.
CPC ..... *G05B 19/0428* (2013.01); *G05B 23/0256* (2013.01); *G01R 31/2829* (2013.01); *G05B 17/02* (2013.01); *G05B 19/054* (2013.01); *G05B 2219/14076* (2013.01); *G05B 2219/14114* (2013.01); *G05B 2219/24038* (2013.01); *G05B 2219/25428* (2013.01); *G05B 2219/33331* (2013.01)

(58) Field of Classification Search
None
See application file for complete search history.

(56) References Cited

U.S. PATENT DOCUMENTS 8,527,139 B1 * 9/2013 Yousuf .............. G06F 11/2242
                                                      701/32.8
2002/0082725 A1 * 6/2002 Dute .................. G05B 19/0423
                                                      700/51
(Continued)

FOREIGN PATENT DOCUMENTS

| EP | 2 096 506 | 9/2009 |
| WO | 2008048501 | 4/2008 |
| WO | 2008142421 | 11/2008 |

OTHER PUBLICATIONS

Extended European Search Report dated Oct. 24, 2018, 8 pages.

*Primary Examiner* — Brent A. Fairbanks
(74) *Attorney, Agent, or Firm* — Boyle Fredrickson, SC

(57) ABSTRACT

A safety input system for monitoring a sensor can include a voltage sensing circuit configured to produce a first detection output upon sensing a signal exceeding a voltage threshold, and a current sensing circuit configured to produce a second detection output upon sensing the signal exceeding a current threshold and/or voltage threshold. The signal can come from a sensor in an industrial automation system, such as a light curtain. The first detection output can be provided to a first processor, and the second detection output can be provided to a second processor, so that two processors can independently monitor the sensor. The signal can be monitored by separate input systems. Periodically the first processor can inject a first test signal into the input system for the second processor to detect, and the second processor can inject a second test signal into the input system for the first processor to detect.

19 Claims, 3 Drawing Sheets

(51) Int. Cl.
*G01R 31/28* (2006.01)
*G05B 19/05* (2006.01)
*G05B 17/02* (2006.01)

(56) References Cited

U.S. PATENT DOCUMENTS

| | | | |
|---|---|---|---|
| 2003/0051203 A1* | 3/2003 | Vasko | H04L 1/1851 |
| | | | 714/781 |
| 2006/0224811 A1* | 10/2006 | Sichner | G05B 19/0428 |
| | | | 710/306 |
| 2009/0219049 A1* | 9/2009 | Meagher | G01R 31/50 |
| | | | 324/762.09 |
| 2009/0319205 A1* | 12/2009 | Borger | G01H 11/08 |
| | | | 702/56 |
| 2013/0231767 A1* | 9/2013 | Sabapathy | G06F 11/0721 |
| | | | 700/95 |
| 2015/0112640 A1 | 4/2015 | Niro et al. | |
| 2016/0286620 A1* | 9/2016 | Zhang | H05B 33/0815 |

\* cited by examiner

SAFETY INPUT SYSTEM FOR MONITORING A SENSOR IN AN INDUSTRIAL AUTOMATION SYSTEM

FIELD OF THE INVENTION

The present invention relates to the field of industrial automation, and more particularly, to an input module configured to monitor a signal from a sensor using first detection circuit configured to produce a first output according to the signal exceeding or failing to exceed a voltage threshold and using a second detection circuit configured to produce a second output according to the signal exceeding or failing to exceed a current threshold.

BACKGROUND OF THE INVENTION

Industrial controllers are specialized computer systems used for the control of industrial processes or machinery, for example, in a factory environment. Generally, an industrial controller executes a stored control program that reads inputs from a variety of sensors associated with the controlled process and machine and, sensing the conditions of the process or machine and based on those inputs and a stored control program, calculates a set of outputs used to control actuators controlling the process or machine.

Industrial controllers differ from conventional computers in a number of ways. Physically, they are constructed to be substantially more robust against shock and damage and to better resist external contaminants and extreme environmental conditions than conventional computers. The processors and operating systems are optimized for real-time control and are programmed with languages designed to permit rapid development of control programs tailored to a constantly varying set of machine control or process control applications.

Generally, the controllers have a highly modular architecture, for example, that allows different numbers and types of input and output modules to be used to connect the controller to the process or machinery to be controlled. This modularity is facilitated through the use of special "control networks" suitable for highly reliable and available real-time communication. Such control networks (for example, ControlNet or EtherNet/IP) differ from standard communication networks (such as Ethernet) by guaranteeing maximum communication delays by pre-scheduling the communication capacity of the network, and/or providing redundant communication capabilities for high-availability.

Typically, sensors provide signals which can be received by processors in the industrial control system. In safety applications, which can include sensors from light curtains monitoring areas of a plant, if all signals are received in first state, which could be an "asserted" or "high" state, a processor could determine that a safe condition exists. Accordingly, the processor could command the industrial control system to execute (or continue executing) a first path of a control program, for example, to operate actuators, machinery and the like. However, if at least one signal is received in a second state, which could be a "de-asserted" or "low" state, the processor could determine that an unsafe condition exists. Accordingly, the processor could command the industrial control system to execute a second path of the control program, for example, to stop the actuators, machinery and the like.

However, in some cases, proper detection of signals from sensors could be susceptible to failure. This could occur, for example, due to hardware and/or mechanical failures of the detection circuitry and/or related modules. It is therefore desirable to provide a detection system for signals from sensors that is less susceptible to failure.

SUMMARY OF THE INVENTION

A safety input system for monitoring a sensor can include a voltage sensing circuit configured to produce a first detection output upon sensing a signal exceeding a voltage threshold, and a current sensing circuit configured to produce a second detection output upon sensing the signal exceeding a current threshold and/or voltage threshold. The signal can come from a sensor in an industrial automation system, such as a light curtain. The first detection output can be provided to a first processor, and the second detection output can be provided to a second processor, so that two processors can independently monitor the sensor. The signal can also be monitored by separate input systems. Periodically, for additional protection, the first processor can inject a first test signal into the input system for the second processor to detect, and the second processor can inject a second test signal into the input system for the first processor to detect.

Accordingly, the invention can provide a single channel input structure capable of one or more of: (1) tolerance of over-voltage faults to at least 60 Volts; (2) sensing both voltage and/or current sourcing input sensors (e.g., switch, proximity sensors, and the like); (3) supporting safety internal pulse testing with on the order of $\geq 100$ µs pulse off width with a wide range of loads (e.g., current sinking and/or voltage resistive loading); (4) performing safety functions even in a single fault mode; and/or (5) meeting Category 3 architecture PL(d) EN/ISO13849-1 requirements for a single channel. In one aspect, the invention can provide a current sensing structure compliant to IEC 61131-2 Type 3 requirements, a voltage sensing structure compliant to IEC 61131-2 Type 3 requirements, internal pulse testing, and a cross compare for safety integrity.

Specifically then, one aspect of the present invention can provide an input module for monitoring a sensor. The input module can include: first and second detection circuits configured to receive a signal for producing first and second outputs, respectively. The first detection circuit can be configured to: (a) produce the first output having a first state upon the signal exceeding a voltage threshold; and (b) produce the first output having a second state upon the signal failing to exceed the voltage threshold. The second detection circuit can be configured to: (a) produce the second output having a first state upon the signal exceeding a current threshold; and (b) produce the second output having a second state upon the signal failing to exceed the current threshold.

Another aspect of the present invention can provide an industrial automation system including: a sensor for providing a signal indicating a state or condition; first and second processors in communication with one another; and an input module in communication with the sensor and the first and second processors. The input module can include: first and second detection circuits configured to receive the signal for producing first and second outputs to the first and second processors, respectively. The first detection circuit can be configured to: (a) produce the first output having a first state upon the signal exceeding a voltage threshold; and (b) produce the first output having a second state upon the signal failing to exceed the voltage threshold. The second detection circuit can be configured to: (a) produce the second output having a first state upon the signal exceeding a current threshold; and (b) produce the second output having a second state upon the signal failing to exceed the current threshold.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE OF THE INVENTION

Figure 1:
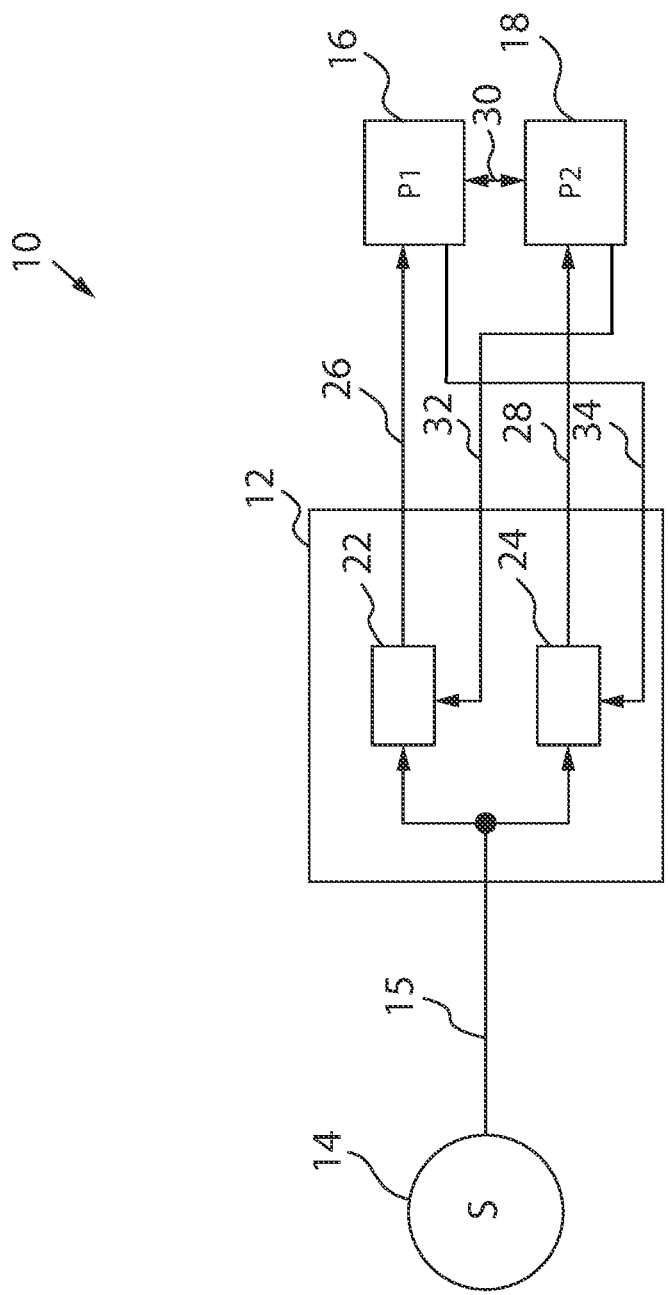
FIG. 1 is an industrial automation system including an input module in communication with a sensor and first and second processors in accordance with an aspect of the invention.

Referring now to FIG. 1, in accordance with an aspect of the invention, an industrial automation system 10 can include an input module 12 in communication with a sensor 14 (identified as "S") and first and second processors 16 and 18 (identified as "P1" and "P2"), respectively. The sensor 14, which could be part of an industrial process or machine, can provide a signal 15 indicating a state or condition of the sensor 14 to the input module 12. For example, a first state of the signal 15, which could be an "asserted" or "high" state, could indicate that a safe condition exists, whereas a second state of the signal 15, which could be a "de-asserted" or "low" state, could indicate that an unsafe condition exists. In one aspect, the sensor 14 could be part of a light curtain.

The input module 12 can include first and second detection circuits 22 and 24, respectively, configured to receive the signal 15. The first detection circuit 22, which can comprise a voltage threshold detection circuit, can be configured to produce a first output 26 having a first state, which could also be an "asserted" or "high" state, upon detecting the signal 15 exceeding a voltage threshold, or produce the first output 26 having a second state, which could also be a "de-asserted" or "low" state, upon detecting the signal 15 failing to exceed the voltage threshold. The first detection circuit 22 can provide the first output 26 to the first processor 16. It should be appreciated that in alternative aspects, inverse logic states (active low) could also be applied.

The second detection circuit 24, which can comprise a current and/or voltage threshold detection circuit, can be configured to produce a second output 28 having a first state, which could also be an "asserted" or "high" state, upon detecting the signal 15 exceeding a current threshold, or produce the second output 28 having a second state, which could also be a "de-asserted" or "low" state, upon detecting the signal 15 failing to exceed the current threshold. The second detection circuit 24 can provide the second output 28 to the second processor 18. Once again, in in alternative aspects, inverse logic states (active low) could also be applied.

Accordingly, the first and second processors 16 and 18, respectively, can each monitor the state or condition of the sensor 14 via the first and second outputs 26 and 28, respectively. The first and second processors 16 and 18, respectively, can also be in communication with one another via a processor communication link 30. In addition, one processor, such as the first processor 16, can be preconfigured to serve as a primary processor, while the other processor (or processors), such as the second processor 18, can be preconfigured to serve as a secondary processor.

Accordingly, the primary processor (P1) can ultimately determine the state or condition of the sensor 14, for execution of a control program, based on a state of the first output 26, and a state of the second output 28 as determined by the secondary processor (P2), as reported via the processor communication link 30, among other things. If the primary processor (P1) ultimately determines that the sensor 14 is in a safe condition, which could correspond to the aforementioned first state of the signal 15, the primary processor (P1) could command the industrial control system to execute (or continue executing) a first path of a control program, which could be to operate actuators, machinery and the like. However, if the primary processor (P1) ultimately determines that the sensor 14 is in an unsafe condition, which could correspond to the aforementioned second state of the signal 15, the primary processor (P1) could instead command the industrial control system to execute a second path of the control program, which could be to stop actuators, machinery and the like. By providing two different detection paths (the first and second detection circuits 22 and 24, respectively) using two different detection methods (voltage and current detection) to two different processors (the first and second processors 16 and 18, respectively) independently monitoring a sensor, the sensor can be more reliably monitored according to higher Safety Integrity Level (SIL) requirements.

In addition, in accordance with another aspect of the invention, the first and second detection circuits 22 and 24, respectively, can receive first and second test signals 32 and 34, respectively, for testing the input module 12 and the first and second outputs 26 and 28, respectively. This can provide additional protection from a failure to properly monitor the sensor 14. The first and second test signals 32 and 34, respectively, could be periodic pulses which could be at least 10 µs in duration, and preferably about 100 µs in duration, and which could be spaced at least 10 milliseconds apart, and preferably about 100 milliseconds apart.

The first and second processors 16 and 18, respectively, can coordinate and time such tests via the processor communication link 30, so that each processor can recognize and distinguish a test condition from an actual change in condition of the sensor 14. For further improved safety integrity, the first and second processors 16 and 18, respectively, can cross compare. The first processor 16 can send the second test signal 34 to the second detection circuit 24. The second detection circuit 24, upon detecting the second test signal 34, can produce the second output 28 with a corresponding state change to the second processor 18. The second processor 18, in turn, can report the test result to the first processor 16, and the first processor 16, in turn, can acknowledge such result. Similarly, the second processor 18 can send the first test signal 32 to the first detection circuit 22. The first detection circuit 22, upon detecting the first test signal 32, can produce the first output 26 with a corresponding state change to the first processor 16. The first processor 16, in turn, can report the test result to the second processor 18, and the second processor 18, in turn, can acknowledge such result.

Figure 2:
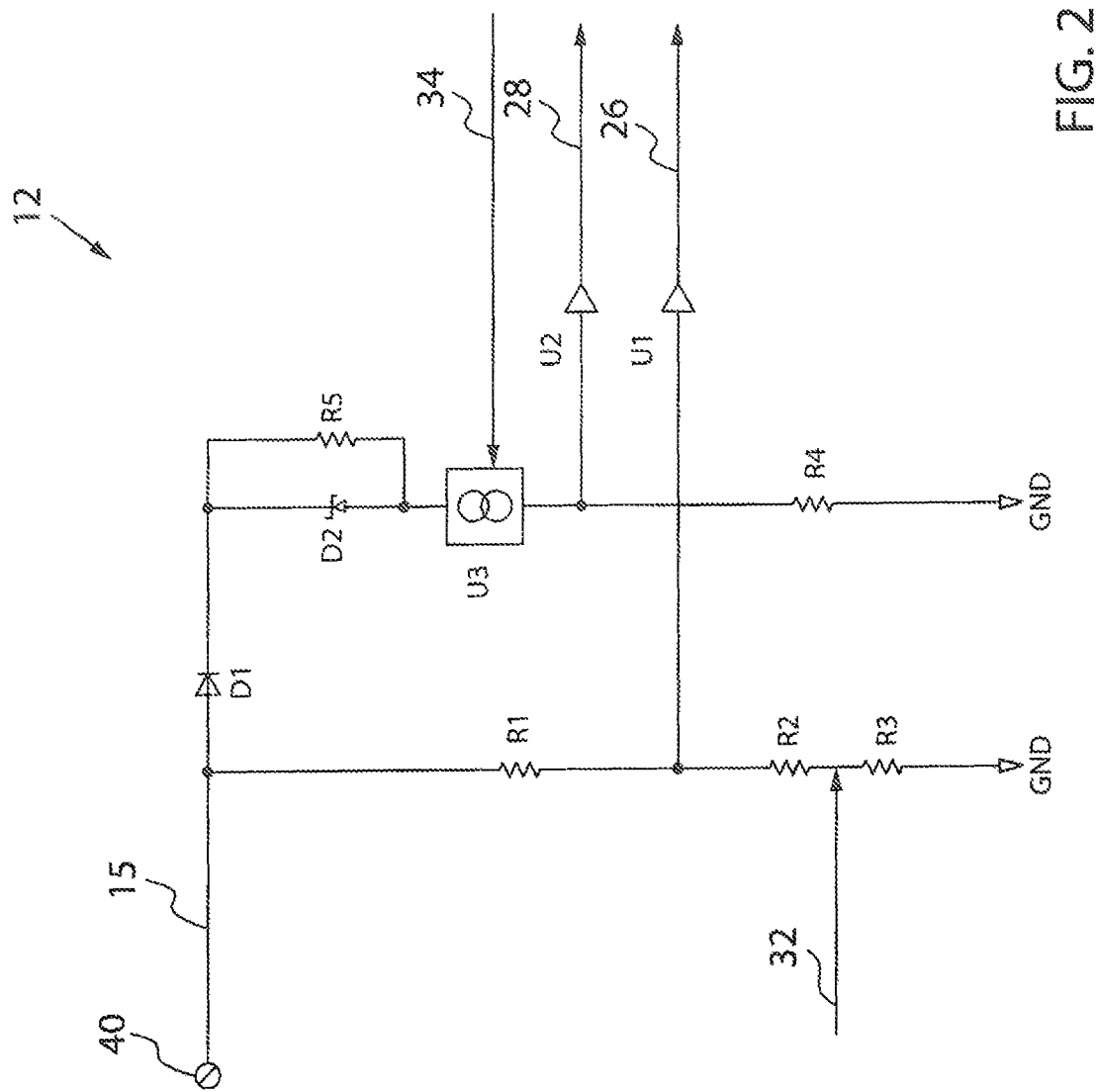
FIG. 2 is schematic diagram for the input module of FIG. 1.

With additional reference to FIG. 2, in which like reference numerals represent like parts throughout, a schematic diagram for the input module 12 is provided in accordance with an aspect of the invention. The input module 12 could include a screw terminal 40 for coupling to the sensor 14 and receiving the signal 15. In one aspect, the signal 15 in the first state (high) could be in the range of about 18-30 Volts and about 2-100 milliamps. Also, the signal 15 in the second state (low) could be the range of about 0-5 Volts and about 0-1.5 milliamps. The signal 15 could be received by the first detection circuit 22, which could include a voltage threshold detection circuit. The voltage threshold detection circuit could comprise, for example, first and second resistors "R1" and "R2," respectively, configured to form a voltage divider with respect to the signal 15. R1 could be about 200 kΩ and R2 could be about 7 kΩ. A first output buffer "U1," in communication with the voltage divider, can compare a voltage drop from the voltage divider to a predetermined voltage threshold of the buffer to produce the first output 26. For example, if the signal 15 is in the first state (high), the voltage divider can produce a voltage drop detected by the first output buffer U1 to exceed the predetermined voltage threshold. Accordingly, the first output buffer U1 can produce the first output 26 having the first state (high). However, if the signal 15 is in the second state (low), or if the signal 15 is absent, such as an open circuit or infinite impedance condition, the first output buffer U1 will fail to detect a voltage drop exceeding the predetermined voltage threshold. Accordingly, the first output buffer U1 can produce the first output 26 having the second state (low).

The signal 15 could also be received by the second detection circuit 24, which could include a current threshold detection circuit. The current threshold detection circuit could comprise, for example, a diode "D1," configured in a forward biased direction, in series with a Zener diode "D2," configured in a reverse biased, in series with a current limiting circuit "U3." The diode D1 can operate to block current from flowing in a reverse direction to the sensor 14. The Zener diode D2 can operate to detect a current flow from the sensor 14 exceeding a predetermined current threshold. A resistor "R5" in parallel to the Zener diode D2, can operate to protect the Zener diode D2 from an overcurrent condition. R5 could be about 5 kΩ. The current limiting circuit U3, and a following series resistor "R4" connected to ground, can operate to limit the detected current flow from the sensor 14. R4 could be about 600Ω, and the current limiting circuit U3 could limit the detected current flow to about 2 milliamps. The current limiting circuit U3 could be configured to accommodate voltages of up to 60 Volts. A second output buffer "U2," in communication with the current limiting circuit U3, can be configured to compare a voltage from the current limiting circuit U3 to a predetermined voltage threshold to produce the second output 28. For example, if the signal 15 is in the first state (high), the diode D1 will be forward biased, and the Zener diode D2 will be reverse biased with a current flow exceeding the predetermined current threshold of the Zener diode D2, which could be about 1.7 milliamps. The current limiting circuit U3, in turn, could limit such current flow at a particular voltage, such as to about 2 milliamps, which voltage, in turn, can be compared to the predetermined voltage threshold of the second output buffer U2 to produce the second output 28 having the first state (high). However, if the signal 15 is in the second state (low), or if the signal 15 is absent, such as an open circuit or infinite impedance condition, the Zener diode D2 will fail to detect a current exceeding the predetermined current threshold, and the second output buffer U2 will fail to detect a voltage exceeding the predetermined voltage threshold. Accordingly, the second output buffer U2 will produce the second output 28 in the second state (low). Also, the diode D1 will block current from flowing in a reverse direction to the sensor 14.

For testing the input module 12, the first test signal 32 can be provided to the voltage divider (formed by the first and second resistors R1 and R2, respectively), such as at a third resistor "R3" connected in series with the voltage divider to ground. R3 could be about 1 kΩ. Accordingly, a pulse at a terminal of R3 could produce a voltage across R2, at the first output buffer U1, exceeding the predetermined voltage threshold for the first output buffer U1, so that the first output buffer U1 produces the first output 26 in the first state (high). Also, the second test signal 34 can be provided to the current limiting circuit U3. A pulse at a terminal of the current limiting circuit U3 could produce a voltage exceeding the predetermined voltage threshold at the second output buffer U2, so that the second output buffer U2 produces the second output 28 in the first state (high). The aforementioned pulses can be periodic, coordinated and timed for proper recognition as described above with respect to FIG. 1.

Figure 3:
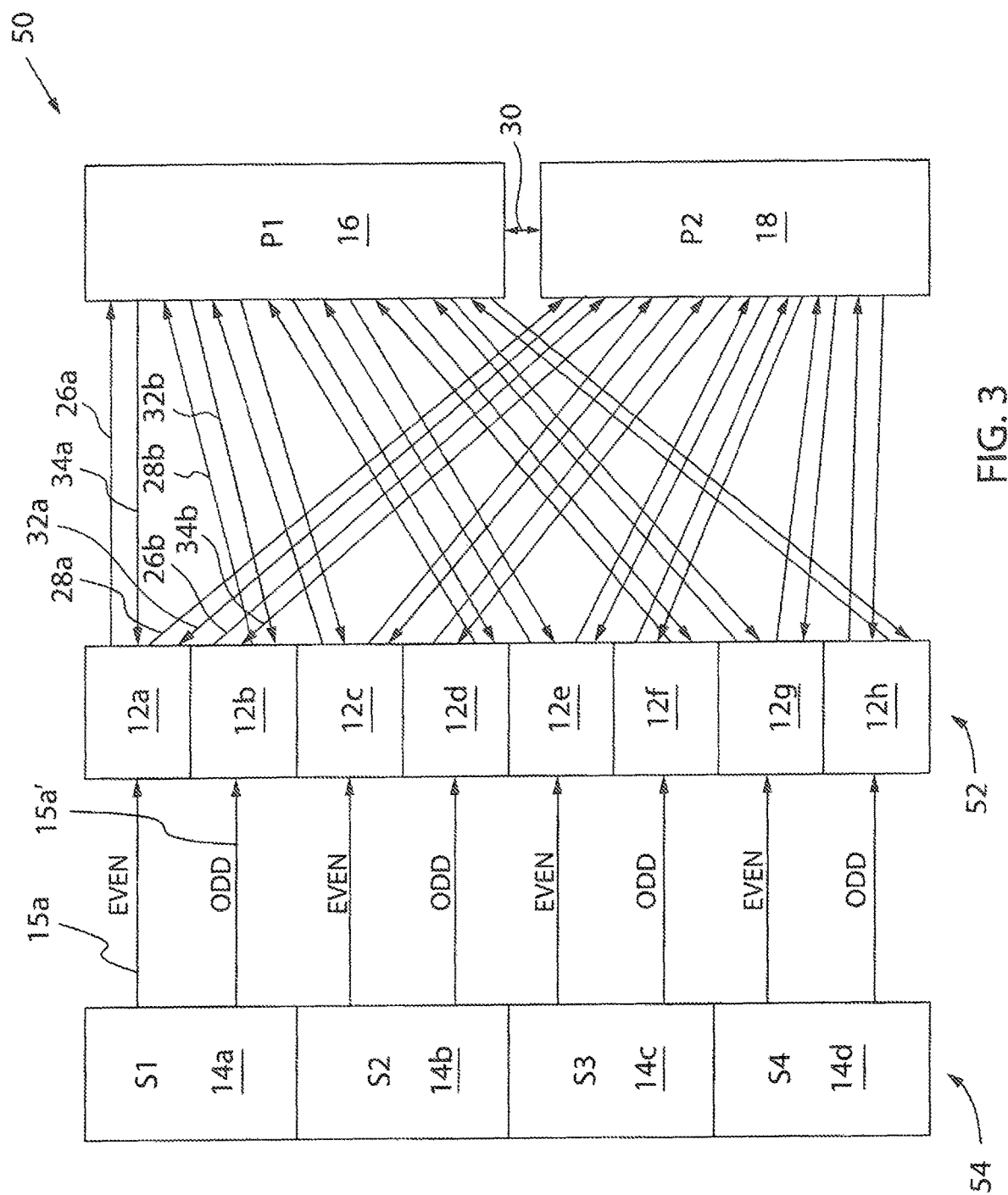
FIG. 3 is an industrial automation system including multiple input modules in communication with multiple sensors and first and second processors in accordance with an aspect of the invention.

Referring now to FIG. 3, in another aspect of the invention, in which like reference numerals represent like parts throughout, an industrial automation system 50 can include an input module assembly 52 having multiple input modules 12 (identified as input modules 12a-12h) in communication with a sensor assembly 54 having multiple sensors 14 (identified as sensors 14a-14d). The input module assembly 52 could be a single device having multiple screw terminals. The sensor assembly 54 could be a single device having multiple sensors, such as a light curtain. Each sensor 14 of the sensor assembly 54 could be configured to produce an even channel signal (such as signal 15a from the sensor 14a) and a corresponding odd channel signal (such as signal 15a' from the sensor 14a). The even and odd channel signals could be redundant signals, or alternatively, could be inverse signals of one another. An input module 12 of the input module assembly 52 can receive a channel at a screw terminal, such as the input module 12a receiving the even channel signal 15a from the sensor 14a, and the input module 12b receiving the odd channel signal 15a' from the sensor 14a. Each input module 12 of the input module assembly 52, in turn, can provide the first and second outputs 26 and 28, via the first and second detection circuits 22 and 24, to the first and second processors 16 and 18, respectively.

In addition, to cross compare, input modules 12 in odd channels can swap inputs and outputs between the first and second processors 16 and 18, respectively, as compared to input modules 12 in even channels. For example, input module 12a (in an even channel) can provide the first output 26a to the first processor 16 and the second output 28a to the second processor 18. In addition, input module 12a can receive the first test signal 32a from the second processor 18 and the second test signal 34a from the first processor 16. However, input module 12b (in an odd channel) can provide the first output 26b to the second processor 18 and the second output 28b to the first processor 16. Also, input module 12a can receive the first test signal 32b from the first processor 16 and the second test signal 34b from the second processor 18. Accordingly, first outputs 26 of input modules 12 in even channels and second outputs 28 of input modules 12 in odd channels can be provided to the first processor 16, and second outputs 28 of input modules 12 in even channels and first outputs 26 of input modules 12 in odd channels can be provided to the second processor 18. Also, the first processor 16 can provide first test signals 32 for testing first outputs 26 of input modules 12 in odd channels, and the second processor 18 is can provide second test signals 34 for testing second outputs 28 of input modules 12 in even channels. Accordingly, the second processor 18 can execute to determine states or conditions of sensors 14 according to the second outputs 28 of input modules 12 in even channels and the first outputs 26 of input modules 12 in odd channels, and the first processor 16 can execute to determine states or conditions of the sensors 14 according to first outputs 26 of input modules 12 in even channels and the second outputs 28 of input modules 12 in odd channels. In addition, the first processor 16, operating as a primary processor, can ultimately determine the state or condition of the sensor assembly 54, for execution of a control program, based on the first outputs 26 of input modules 12 in even channels, the second outputs 28 of input modules 12 in odd channels, and results from the second processor 18 via the processor communication link 30.

The present invention may be part of a "safety system" used to protect human life and limb in a field, construction or other environment. Nevertheless, the term "safety," "safely" or "safe" as used herein is not a representation that the present invention will make the environment safe or that other systems will produce unsafe operation. Safety in such systems depends on a wide variety of factors outside of the scope of the present invention including: design of the safety system, installation and maintenance of the components of the safety system, and the cooperation and training of individuals using the safety system. Although the present invention is intended to be highly reliable, all physical systems are susceptible to failure and provision must be made for such failure.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. An input module for monitoring a sensor, the input module comprising:
    a terminal configured to couple to a sensor for receiving a signal from the sensor;
    first and second detection circuits coupled to the terminal, the first and second detection circuits differing from one another, the first and second detection circuits being configured to receive, in tandem, the signal from the sensor at the terminal, and to produce, in tandem, first and second outputs, respectively, according to the signal,
    wherein the first detection circuit is configured to:
    (a) produce the first output having a first state upon the signal exceeding a voltage threshold; and
    (b) produce the first output having a second state upon the signal failing to exceed the voltage threshold,
    wherein the second detection circuit is configured to:
    (a) produce the second output having a first state upon the signal exceeding either a second voltage threshold or a current threshold; and
    (b) produce the second output having a second state upon the signal failing to exceed either the second voltage threshold or the current threshold,
    wherein first and second processors in communication with one another are configured to receive the first and second outputs, respectively,
    wherein the first processor determines the state or condition of the sensor based on the first output from the first detection circuit and communication from the second processor,
    wherein the communication from the second processor includes the second output from the second detection circuit, and
    wherein the first and second processors control test signals for testing the first and second detection circuits.

2. The input module of claim 1, wherein the test signals comprise first and second test signals with the first and second detection circuits being configured to receive the first and second test signals for testing the first and second outputs, respectively.

3. The input module of claim 2, wherein the first and second test signals comprise periodic pulses.

4. The input module of claim 3, wherein each periodic pulse is at least 10 μs in duration, and the periodic pulses are at least 10 milliseconds apart.

5. The input module of claim 1, wherein the first detection circuit comprises first and second resistors configured to form a voltage divider with respect to the signal.

6. The input module of claim 5, wherein the first detection circuit further comprises an output buffer in communication with the voltage divider, wherein the output buffer is configured to produce the first output.

7. The input module of claim 1, as discussed above, wherein the second detection circuit comprises a Zener diode configured in a reverse biased direction, which conducts current when the voltage across the Zener diode exceeds the second voltage threshold.

8. The input module of claim 7, wherein the second detection circuit further comprises an output buffer in communication with the Zener diode, wherein the output buffer is configured to produce the second output.

9. An industrial automation system comprising:
a sensor for providing a signal indicating a state or condition;
first and second processors in communication with one another; and at least one input module in communication with the sensor and the first and second processors, the input module comprising:
a terminal coupled to the sensor for receiving the signal from the sensor; first and second detection circuits coupled to the terminal, the first and second detection circuits differing from one another, the first and second detection circuits being configured to receive, in tandem, the signal from the sensor at the terminal, and to produce, in tandem, first and second outputs to the first and second processors, respectively, according to the signal,
wherein the first detection circuit is configured to:
(a) produce the first output having a first state upon the signal exceeding a voltage threshold; and
(b) produce the first output having a second state upon the signal failing to exceed the voltage threshold, and
wherein the second detection circuit is configured to:
(a) produce the second output having a first state upon the signal exceeding either a second voltage threshold or a current threshold; and
(b) produce the second output having a second state upon the signal failing to exceed either the second voltage threshold or the current threshold,
wherein the first processor determines the state or condition of the sensor based on the first output from the first detection circuit and communication from the second processor,
wherein the communication from the second processor includes the second output from the second detection circuit, and
wherein the first and second processors control test signals for testing the first and second detection circuits.

10. The system of claim 9, wherein the test signals comprise first and second test signals with the first processor being configured to provide the second test signal to the second detection circuit for testing the second output and the second processor being configured to provide the first test signal to the first detection circuit for testing the first output.

11. The system of claim 10, wherein the first and second test signals comprise periodic pulses.

12. The system of claim 11, wherein each periodic pulse is at least 10 µs in duration, and the periodic pulses are at least 10 milliseconds apart.

13. The system of claim 9, wherein the sensor is part of a light curtain.

14. The system of claim 9, wherein the signal is one of a plurality of signals, the sensor is one of a plurality of sensors and the input module is one of a plurality of input modules, and wherein each sensor is configured to provide a first signal to a first input module and a corresponding second signal to a second input module.

15. The system of claim 14, wherein the terminal is one of a plurality of terminals, and wherein the plurality of sensors is coupled to the plurality of input modules at the plurality of terminals.

16. The system of claim 14, wherein first outputs of input modules receiving first signals and second outputs of input modules receiving second signals are provided to the first processor, and wherein second outputs of input modules receiving first signals and first outputs of input modules receiving second signals are provided to the second processor.

17. The system of claim 16, wherein the second processor determines states or conditions of the plurality of sensors according to the second outputs of input modules receiving first signals and the first outputs of input modules receiving second signals, and the first processor determines states or conditions of the plurality of sensors according to the first outputs of input modules receiving first signals and the second outputs of input modules receiving second signals.

18. The system of claim 14, wherein the first processor is configured to provide a plurality of first test signals to first detection circuits for testing first outputs of input modules receiving second signals, and the second processor is configured to provide second test signals to second detection circuits for testing second outputs of input modules receiving first signals.

19. The system of claim 18, wherein the plurality of first test signals and the plurality of second test signals comprise periodic pulses.

* * * * *